United States Patent
Nagasaka

(10) Patent No.: US 6,809,607 B2
(45) Date of Patent: Oct. 26, 2004

(54) CIRCUIT AND METHOD FOR COMPENSATING FOR NON-LINEAR DISTORTION

(75) Inventor: Hiroyuki Nagasaka, Yokohama (JP)

(73) Assignee: Samsung Electronics Co., Ltd. (KR)

( * ) Notice: Subject to any disclaimer, the term of this patent is extended or adjusted under 35 U.S.C. 154(b) by 104 days.

(21) Appl. No.: 10/100,618

(22) Filed: Mar. 18, 2002

(65) Prior Publication Data

US 2002/0130727 A1 Sep. 19, 2002

(30) Foreign Application Priority Data

Mar. 19, 2001 (JP) ........................................ 2001-079534

(51) Int. Cl.[7] ................................................ H03C 3/00
(52) U.S. Cl. .................... 332/103; 332/107; 330/149; 330/136; 330/256; 330/294; 375/296
(58) Field of Search ................................ 330/149, 136, 330/256, 294; 375/296; 329/306; 332/103, 107; 455/126

(56) References Cited

U.S. PATENT DOCUMENTS 6,396,344 B1 * 5/2002 Gentzler et al. ............ 330/149

FOREIGN PATENT DOCUMENTS

JP 0577332002 2/2002

* cited by examiner

Primary Examiner—Arnold Kinkead
(74) Attorney, Agent, or Firm—Dilworth & Barrese LLP

(57) ABSTRACT

A non-linear distortion compensation circuit and method automatically sets to an optimal value a phase shift of a variable phase shifter and an attenuation of an attenuator according to a transmission frequency, in a non-linear distortion extractor for extracting a non-linear distortion component generated during non-linear high-power amplification. A variable phase shifter shifts adjusts a phase of a signal determined by quadrature modulating the baseband signal. A high-power amplifier non-linearly high-power amplifies the quadrature-modulated signal. An attenuator attenuates the amplified signal by a gain equal to that of the high-power amplifier. A subtracter extracts non-linear distortion generated during the non-linear high-power amplification by subtracting the phase-shifted quadrature-modulated signal from an output of the attenuator. A control circuit automatically adjusts a phase shift of the variable phase shifter and an attenuation of the attenuator according to a transmission frequency.

2 Claims, 5 Drawing Sheets

CIRCUIT AND METHOD FOR COMPENSATING FOR NON-LINEAR DISTORTION

PRIORITY

This application claims priority to an application entitled "Circuit and Method for Compensating for Non-linear Distortion" filed in the Japanese Patent Office on Mar. 19, 2001 and assigned Serial No. 2001-79534, the contents of which are hereby incorporated by reference.

BACKGROUND OF THE INVENTION

1. Field of the Invention

The present invention relates generally to a quadrature modulation circuit used in a radio transmitter, and in particular, to an apparatus and method for compensating for non-linear distortion generated during high-power amplification after quadrature modulation of a baseband signal.

2. Description of the Related Art

A conventional quadrature (or orthogonal) modulation circuit quadrature-modulates a baseband signal and then high-power amplifies the modulated signal. The high-power amplified modulated signal is subject to non-linear amplification in order to improve power efficiency. This is because an amplification region of an amplifier is divided into a linear region and a non-linear region and the high-power amplification is performed in the non-linear region. When amplified in the non-linear region, the amplified modulated signal suffers non-linear distortion. Thus, in order to linearize an input/output characteristic, it is necessary to compensate for distortion of the non-linearly distorted signal. A typical, conventional non-linear distortion compensation circuit includes a predistortion-type non-linear distortion compensation circuit shown in FIG. 4.

A predistortion-type non-linear distortion compensation circuit will be described with reference to FIG. 4. Referring to FIG. 4, complex baseband signals I and Q are applied to a first D/A (Digital-to-Analog) converter 2 and a second D/A converter 3 through a distortion compensation operator 1. The first and second D/A converters 2 and 3 convert received digital signals to analog signals, and provide the converted analog signals to a quadrature modulator 4. The quadrature modulator 4 quadrature-modulates received baseband signals I and Q, and provides the quadrature-modulated signals to a high-power amplifier (HPA) 5. The high-power amplifier 5 then high-power amplifies the quadrature-modulated analog signals.

A compensation data table 7 stores compensation data in the form of a table. The compensation data stored in the compensation data table 7 is determined by previously measuring a non-linear characteristic of the high-power amplifier 5 during amplification. A power calculator 6 calculates power of the baseband signals I and Q, and provides the calculated power information to the compensation data table 7. The compensation data table 7 reads compensation data corresponding to the calculated power by consulting the table according to the power of the baseband signals I and Q, and then provides the read compensation data to the distortion compensation operator 1.

In this way, the distortion compensation operator 1 previously applies an inverse distortion component for canceling the non-linear distortion generated in the high-power amplifier 4 to the received baseband signals I and Q before quadrature modulation. The signals including the inverse distortion component for removing the non-linear distortion are provided to the first and second D/A converters 2 and 3. As a result, the modulated signals high-power amplified by the high-power amplifier 5 have reduced the non-linear distortion.

As stated above, the conventional predistortion-type non-linear distortion compensation circuit compensates for non-linear distortion through the use of the data table based on the power of the baseband signals, without considering a characteristic deviation of the high-power amplifier 5 and a variation of temperature. Therefore, overall performance of the circuit may be deteriorated due to the characteristic deviation of the high-power amplifier 5 and the temperature variation.

To solve this problem, a directional combiner 8, as illustrated in FIG. 5, divides an output of the high-power amplifier 5 into two signals, and applies one of the divided signals to a quadrature demodulator 9. The quadrature demodulator 9 quadraturede-modulates the divided signal and feeds the demodulated divided signal to a compensation data operator 10. The compensation data operator 10 multiplies a coefficient, based on the feedback information, by data read from an internal compensation data table (though not shown, it is equal to the compensation data table 7 of FIG. 4). As a result, the compensation data operator 10 provides the distortion compensation operator 1 with compensated data having a high accuracy regardless of the characteristic deviation of the high-power amplifier 5 and the temperature variation.

However, since the elements 8–10 generate pseudo non-linear distortion, it is not possible to completely resolve the problem. In addition, all the elements perform a complicated digital operation, resulting in an increase in the circuit size and cast Further, the increase in the circuit size may increase power consumption, causing a reduction in a batter-run time of a mobile communication terminal using a battery as a power source.

To solve this problem, the applicant has proposed a non-linear distortion compensation circuit of FIG. 3, disclosed in Japanese patent application No. 2000-233631, the contents of which are hereby incorporated by reference. The non-linear distortion compensation circuit includes directional combiners/dividers 19 and 21, a delay circuit/phase shifter 20, an attenuator 13, a subtracter 14, a quadrature demodulator 15, a phase adjuster 22, amplitude adjusters 23 and 24, and subtracters 16 and 17. Further, the non-linear distortion compensation circuit includes a quadrature modulator 11, a carrier generator 18 and a transmission frequency control circuit 30. The transmission frequency control circuit 30 changes the frequency of a carrier signal output from the carrier generator 18 when a transmission channel is changed according to a carrier frequency setting signal.

The non-linear distortion compensation circuit interposes the directional combiner/divider 19 between the quadrature modulator 11 and a high-power amplifier 12. The directional combiner/divider 19 divides a modulated signal provided from the quadrature modulator 11 into two signals, and provides one of the divided modulated signals to the delay circuit/phase shifter 20 and provides the other divided modulated signal to the high-power amplifier 12. The delay circuit/phase shifter 20 then shifts the phase of the received signal to match it to the phase of an output signal of the attenuator 13, and then provides the phase-shifted signal to the subtracter 14.

Also, an output of the high-power amplifier 12 is divided into two signals by the directional combiner/divider 21: one of the two signals becomes an output signal and the other signal is provided to the attenuator 13. The subtracter 14 calculates a difference between the signal from the delay circuit/phase shifter 20 and the signal from the attenuator 13, and provides the calculated difference to the phase adjuster 22. That is, a non-linear distortion component calculated by the subtracter 14 is phase-adjusted through the phase adjuster 22, and then provided to the quadrature demodulator 15. Baseband non-linear distortion components output from the quadrature demodulator 15 are amplitude-adjusted to a proper level through the amplitude adjusters 23 and 24, and then provided to the subtracters 16 and 17. A non-linear distortion extractor 1A for extracting a non-linear distortion component from the non-linearly high-power amplified modulated signal includes the directional combiners/dividers 19 and 21, the delay circuit/phase shifter 20, the attenuator 13 and the subtracter 14.

The non-linear distortion compensation circuit of FIG. 3 can solve the above-stated problem, but it has the following problem. Each time a transmission channel of a radio signal is changed, i.e., each time a frequency of the carrier generator 18 is changed to other frequencies, it is necessary to readjust both phase delay of the delay circuit/phase shifter 20 and an attenuation of the attenuator 13 in the non-linear distortion extractor 1A. Specifically, a change in the transmission frequency leads to a variation in a phase delay of the delay circuit/phase shifter 20 and a gain and a non-linear distortion characteristic of the high-power amplifier 12. As a result, the modulated transmission signal is not completely removed, and the subtracter 14 cannot then extract the pure distortion component.

SUMMARY OF THE INVENTION

Therefore, it is an object of the present invention to provide a non-linear distortion compensation circuit and method for automatically setting to an optimal value a phase delay of a phase adjuster and an attenuation of an attenuator according to a transmission frequency, in a non-linear distortion extractor for extracting a non-linear distortion component generated during non-linear high-power amplification.

To achieve the above and other objects, the present invention provides a method for compensating for non-linear distortion generated during non-linear high-power amplification in a transmitter for quadrature-modulating a baseband signal, non-linearly high-power amplifying the quadrature-modulated baseband signal, extracting a non-linear distortion component from the non-linearly high-power amplified modulated signal, quadrature demodulating the extracted distortion component into a baseband distortion component, and overlapping a phase-inversed distortion component of the quadrature-demodulated baseband distortion component with the baseband signal. The method comprises shifting a phase of a signal determined by quadrature modulating the baseband signal; non-linearly high-power amplifying the quadrature-modulated signal by a high-power amplifier, and then attenuating the amplified signal by a gain of the high-power amplifier; extracting non-linear distortion generated during the non-linear high-power amplification by subtracting the phase-adjusted quadrature-modulated signal from the attenuated signal; and automatically adjusting a phase delay of the phase-adjusted signal and an attenuation of the attenuated signal according to a transmission frequency.

To achieve the above and other objects, the present invention provides a circuit for compensating for non-linear distortion generated during non-linear high-power amplification in a transmitter for quadrature-modulating a baseband signal, non-linearly high-power amplifying the quadrature-modulated baseband signal, extracting a non-linear distortion component from the non-linearly high-power amplified modulated signal, quadrature demodulating the extracted distortion component into a baseband distortion component, and overlapping a phase-inversed distortion component of the quadrature-demodulated baseband distortion component with the baseband signal. A variable phase shifter shifts a phase of a signal determined by quadrature modulating the baseband signal. A high-power amplifier non-linearly high-power amplifies the quadrature-modulated signal. A variable attenuator attenuates the amplified signal by a gain of the high-power amplifier. A subtracter extracts non-linear distortion generated during the non-linear high-power amplification by subtracting the phase-adjusted quadrature-modulated signal from an output of the attenuator. A control circuit automatically adjusts a phase delay of the variable phase shifter and an attenuation of the variable attenuator according to a transmission frequency.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF THE PREFERRED EMBODIMENT

A preferred embodiment of the present invention will be described herein below with reference to the accompanying drawings. In the following description, well-known functions or constructions are not described in detail since they would obscure the invention in unnecessary detail.

Figure 1:
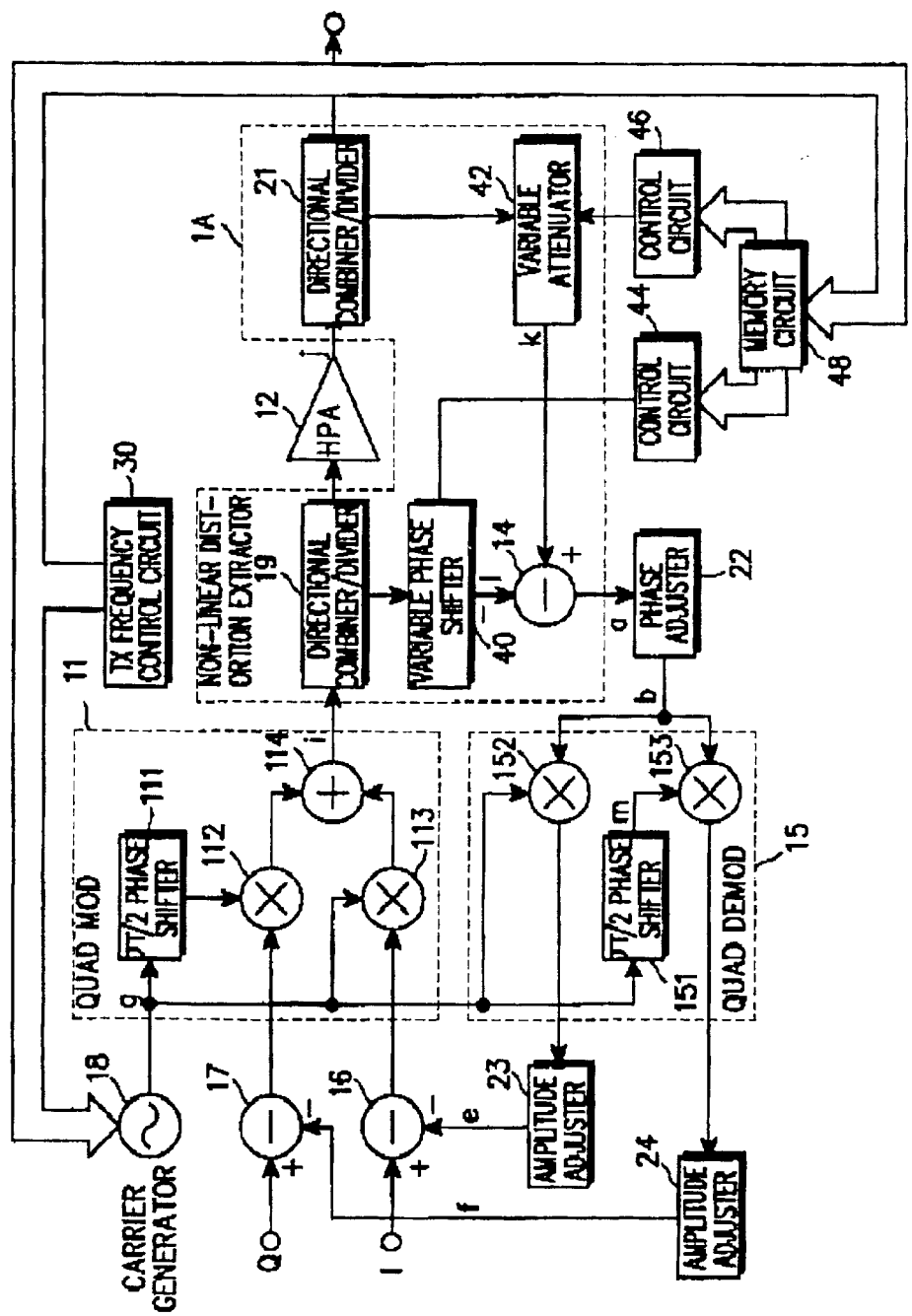
FIG. 1 illustrates a structure of a non-linear distortion compensation circuit according to a preferred embodiment of the present invention.

FIG. 1 illustrates a structure of a non-linear distortion compensation circuit according to a preferred embodiment of the present invention. A structure and operation of the non-linear distortion compensation circuit according to the present invention will be described herein below with reference to FIG. 1.

Figure 3:
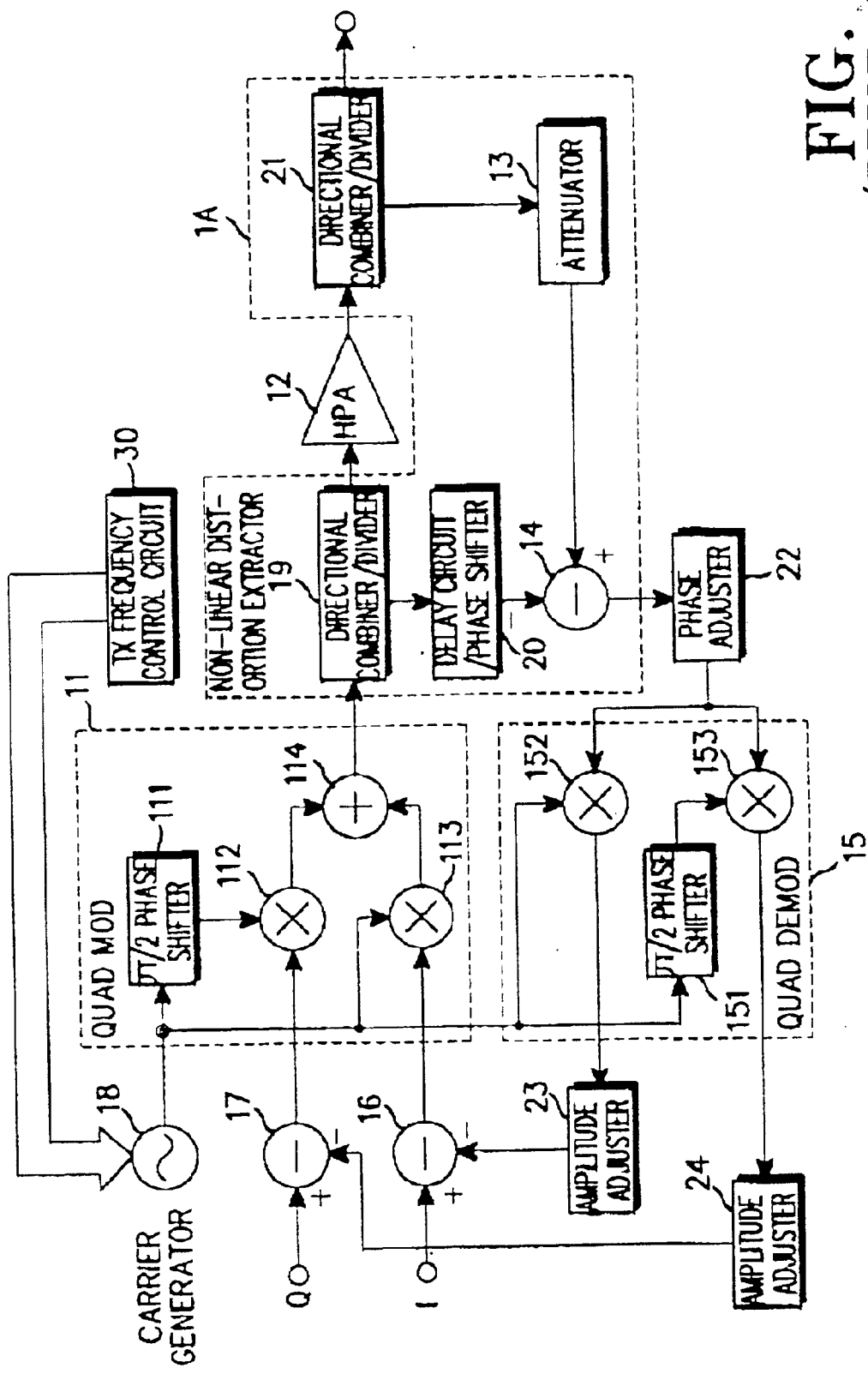
FIG. 3 illustrates a structure of a conventional non-linear distortion compensation circuit.
Figure 4:
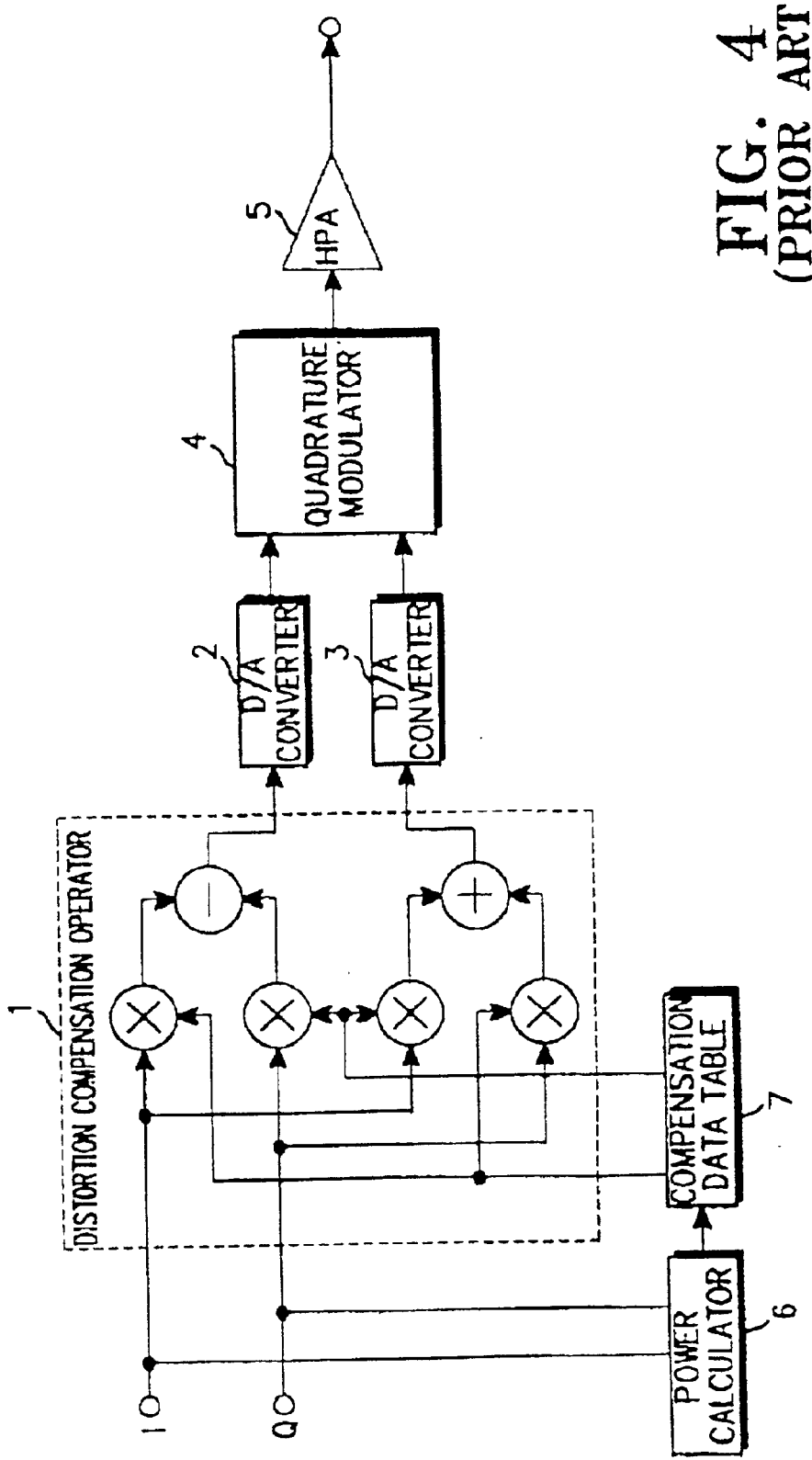
FIG. 4 illustrates a structure of a conventional predistortion-type non-linear distortion compensation circuit.
Figure 5:
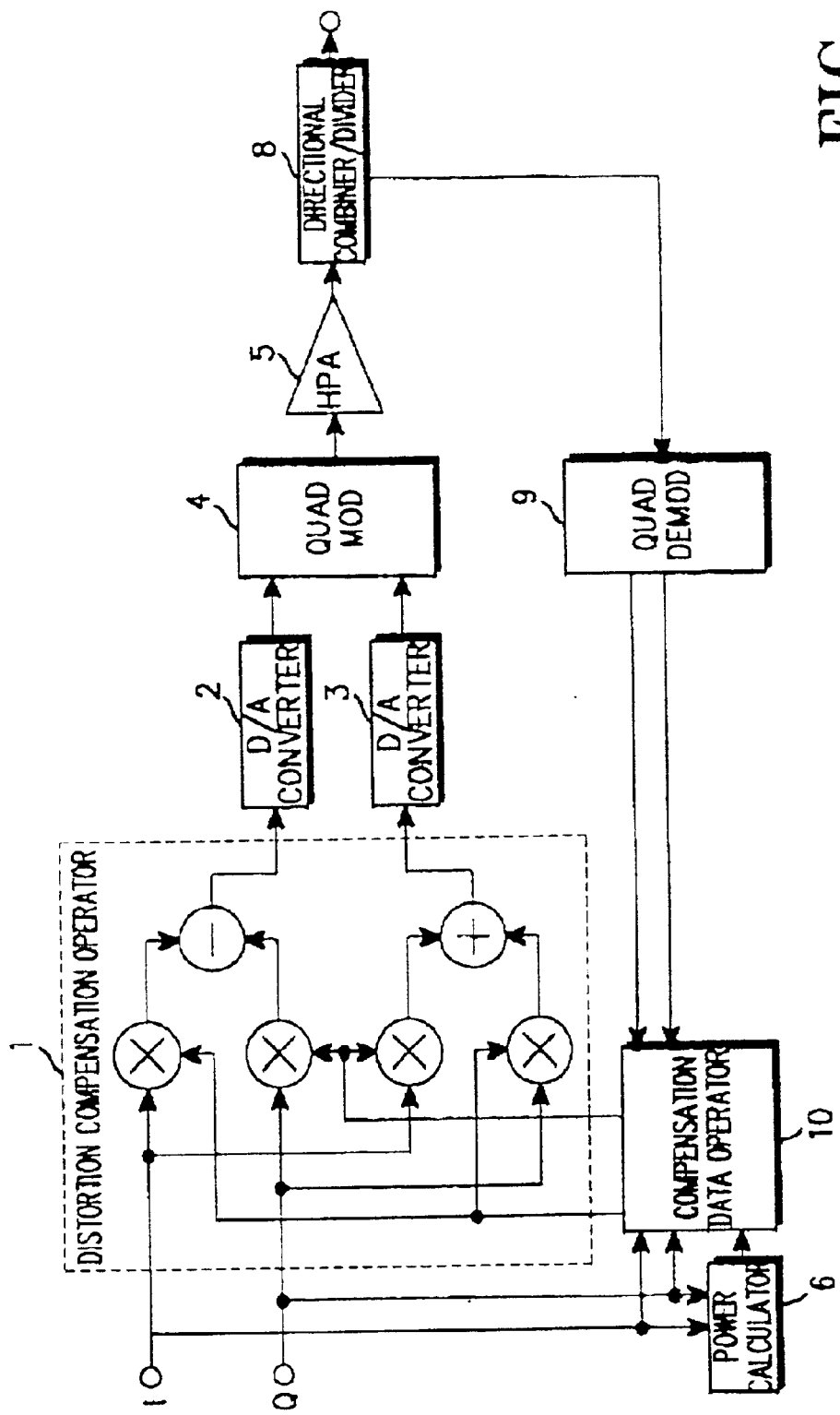
FIG. 5 illustrates a structure of a modified conventional non-linear distortion compensation circuit.

Reference will be made to the differences between the conventional non-linear distortion compensation circuit of FIG. 3 and the novel non-linear distortion compensation circuit of FIG. 1. The novel non-linear distortion compensation circuit includes an electrically controllable variable phase shifter 40 and an electrically controllable variable attenuator 42 in place of the delay circuit/phase shifter 20 and the attenuator 13 in the non-linear distortion extractor 1A of FIG. 3, respectively. Further, the non-linear distortion compensation circuit further includes a memory circuit 48 and control circuits 44 and 46 for generating control signals for controlling the variable phase shifter 40 and the variable attenuator 42. The other elements are identical to those of the conventional non-linear distortion compensation circuit, so a detailed description of the elements will be avoided for simplicity.

In order for the non-linear distortion extractor 1A to correctly extract only the distortion component at every available transmission channel frequency, optimal control signals provided to the variable phase shifter 40 and the variable attenuator 42 are measured and then stored in the memory circuit 48. Therefore, the control circuits 44 and 46 provide optimal control signals received from the memory circuit 48 to the variable phase shifter 40 and the variable attenuator 42, making it possible to extract an optimal distortion component. The control signals stored in the memory circuit 48 are read by a carrier frequency setting signal output from the transmission frequency control circuit 30, and then provided to the control circuits 44 and 46. For setting of the transmission channel frequency (or transmission frequency), the transmission frequency control circuit 30 provides a frequency division ratio to a certain circuit constituting a PLL (Phase Locked Loop, not shown in FIG. 1) in the carrier generator 18. For selection of the transmission channel, a carrier frequency of the carrier signal output from the carrier generator 18 is set according to a carrier frequency setting signal output from the transmission frequency control circuit 30. At the same time, control data, proper to the channel frequency selected by the transmission frequency control circuit 30, is read out from the memory circuit 48, and then provided to the control circuits 44 and 46. The control circuits 44 and 46 then convert the provided signals into associated control signals, and provide the control signals to the variable phase shifter 40 and the variable attenuator 42, respectively. Therefore, it is possible to extract only the non-linear distortion as an optimal value during non-linear high-power amplification based on a difference between a phase delay of the variable phase shifter 40, which varies according to the transmission frequency, and an attenuation of the variable attenuator 42.

Meanwhile, the subtracters 16 and 17 subtract distortion components e and f from the baseband signals I and Q, respectively, and provide the subtracted signals to the quadrature modulator 11. A multiplier 112 in the quadrature modulator 11 multiplies the base band signal Q output from the subtracter 17 by a signal determined by phase-shifting a signal generated by the carrier generator 18 by $\pi/2$ in a $\pi/2$ phase shifter 111, and provides the multiplied signal to an adder 114. A multiplier 113 in the quadrature modulator 11 multiplies the baseband signal I output from the subtracter 16 by the carrier signal generated by the carrier generator 18, and provides the multiplied signal to the adder 114. The adder 114 adds the output signal of the multiplier 112 and the output signal of the multiplier 113, for quadrature modulation. A quadrature-modulated signal i output from the quadrature modulator 11 is divided into two signals by the directional combiner/divider 19. One of the two signals divided by the directional combiner/divider 19 is provided to the high-power amplifier 12, and the other signal is provided to the variable phase shifter 40.

The high-power amplifier 12 high-power amplifies the quadrature-modulated signal by a gain of K. An output signal j of the high-power amplifier 12 is divided into two signals by the directional combiner/divider 21: one of the divided signals becomes an output signal and the other signal is provided to the variable attenuator 42. The variable attenuator 42 attenuates the provided signal by the gain of K of the high-power amplifier 12. An output signal k of the variable attenuator 42 is provided to the subtracter 14.

Further, the variable phase shifter 40 shifts a phase of the divided signal of the quadrature-modulated signal i and provides the phase-shifted signal to the subtracter 14. The subtracter 14 then calculates a difference between the signal received from the variable phase shifter 40 and the signal output from the variable attenuator 42. That is, the signal output from the subtracter 14 becomes a pure non-linear distortion component a calculated by subtracting a quadrature-modulated distortion-free signal l output through the directional combiner/divider 19 and the variable phase shifter 40, from the non-linear distortion containing signal k output from the high-power amplifier 12 through the directional combiner/divider 21 and the variable attenuator 42. The non-linear distortion component a is phase-adjusted by the phase adjuster 22, and then provided to multipliers 152 and 153 in the quadrature demodulator 15.

Meanwhile, a carrier signal g output from the carrier generator 18 is provided to the quadrature demodulator 15. The multiplier 152 in the quadrature demodulator 15 multiplies a non-linear distortion component b output from the phase adjuster 22 by the carrier signal g, and provides the multiplied signal to the amplitude adjuster 23. The multiplier 153 in the quadrature demodulator 15 multiplies the non-linear distortion component b output from the phase adjuster 22 by a carrier signal m calculated by shifting the phase of the carrier signal g by $\pi/2$ in a $\pi/2$ phase shifter 151, and provides the multiplied signal to the amplitude adjuster 24. That is, the multipliers 152 and 153 demodulate their input signals. The demodulated signals from the multipliers 152 and 153 are amplitude-adjusted by the amplitude adjusters 23 and 24, and then provided to the subtracters 16 and 17 as baseband distortion components e and f respectively.

Thereafter, the subtracter 16 subtracts the distortion component e generated by an amplification operation of the high-power amplifier 12 from the baseband signal I, thus providing to the quadrature modulator 11 with a baseband signal I overlapped with an inverse distortion component. Similarly, the subtracter 17 subtracts the distortion component f generated by an amplification operation of the high-power amplifier 12 from the baseband signal Q, thus providing to the quadrature modulator 11 with a baseband signal Q overlapped with an inverse distortion component. That is, the subtracters 16 and 17 overlap the baseband signals I and Q with the distortion components e and f of the inverse distortion characteristic (removing the non-linear distortion component generated during high-power amplification) in a baseband generated by quadrature-modulating the distortion component extracted by the subtracter 14. This process removes the non-linear distortion generated during the non-linear high-power amplification in the high-power amplifier 12 after quadrature-modulating the baseband signals overlapped with the inverse distortion component by the quadrature modulator 11.

Figure 2:
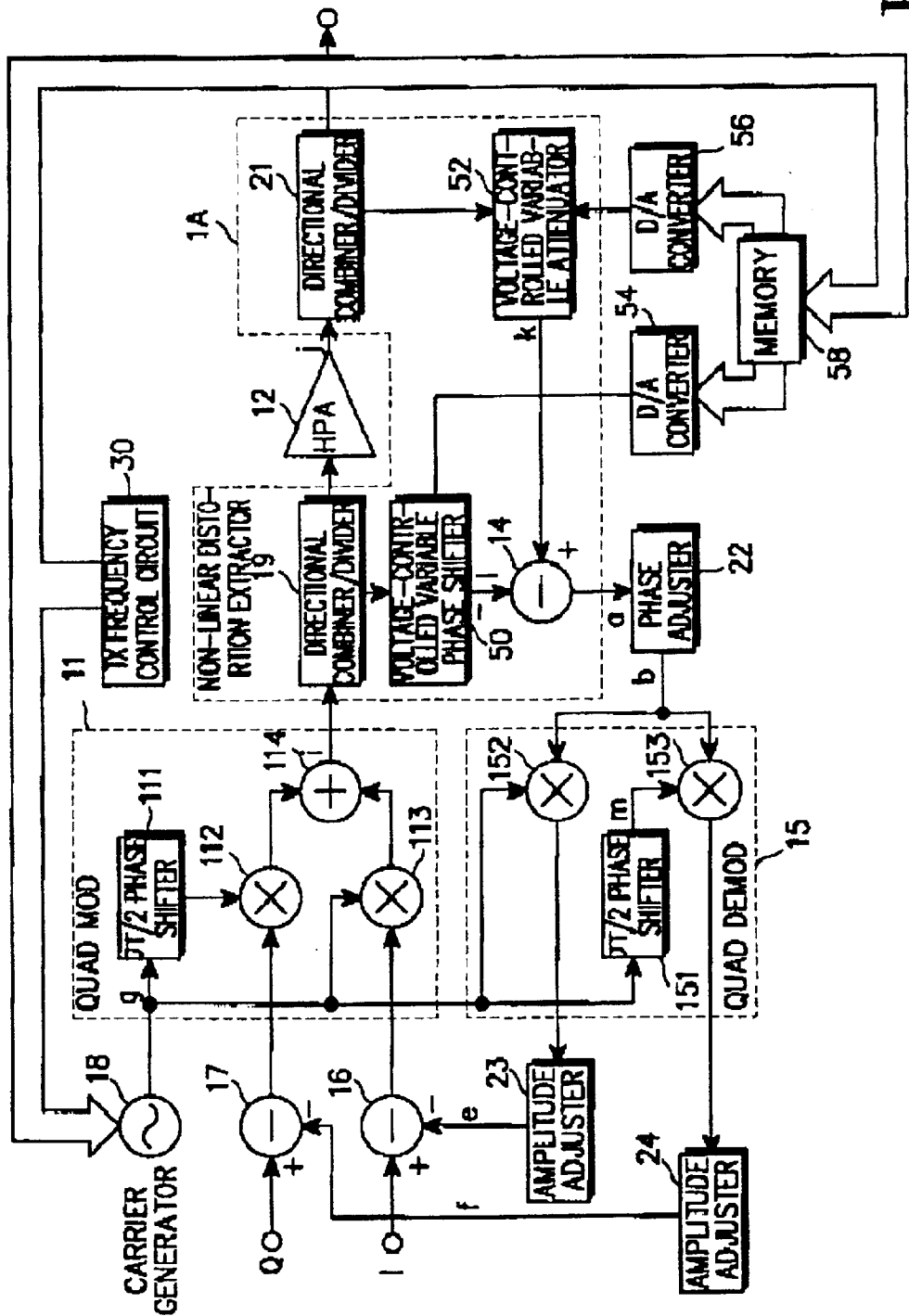
FIG. 2 illustrates a structure of a non-linear distortion compensation circuit according to a second embodiment of the present invention.

FIG. 2 illustrates a structure of a non-linear distortion compensation circuit according to a second embodiment of the present invention. A description of the non-linear distortion compensation circuit of FIG. 2 will be made in comparison with the non-linear distortion compensation circuit of FIG. 1.

Compared with the non-linear distortion compensation circuit of FIG. 1, the non-linear distortion compensation circuit of FIG. 2 substitutes a voltage-controlled variable phase shifter 50, a voltage-controlled variable attenuator 52, D/A converters 54 and 56, and a memory 58 for the variable phase shifter 40, the variable attenuator 42, the control circuits 44 and 46, and the memory circuit 48 of FIG. 1, respectively. The other elements are equal in structure and operation to those of FIG. 1, so a detailed description of them will be avoided for simplicity. In addition, since the variable phase shifter 50 and the variable attenuator 52 are dependent upon a control voltage, they may be replaced with a variable phase shifter and a variable attenuator that are dependent on a control signal.

As described above, a predistortion-type non-linear high-power amplification transmitter according to the present invention automatically sets a phase delay of a phase shifter and an attenuation of a variable attenuator to an optimal value according to a transmission frequency, thus making it possible to extract an optimal non-linear distortion component regardless of the transmission frequency. As a result, it is possible to perform optimal non-linear distortion compensation.

While the invention has been shown and described with reference to a certain preferred embodiment thereof, it will be understood by those skilled in the art that various changes in form and details may be made therein without departing from the spirit and scope of the invention as defined by the appended claims.

What is claimed is:

1. A method for compensating for non-linear distortion generated during non-linear high-power amplification in a transmitter for quadrature-modulating a baseband signal, non-linearly high-power amplifying the quadrature-modulated baseband signal, extracting a non-linear distortion component from the non-linearly high-power amplified modulated signal, quadrature demodulating the extracted distortion component into a baseband distortion component, and overlapping a phase-inversed distortion component of the quadrature-demodulated baseband distortion component with the baseband signal, comprising the steps of:

variably shifting a phase of a signal determined by quadrature modulating the baseband signal;

non-linearly high-power amplifying the quadrature-modulated signal by a high-power amplifier;

variably attenuating the amplified signal by a gain equal to that of the high-power amplifier;

extracting non-linear distortion generated during the non-linear high-power amplification by subtracting the phase-shifted quadrature-modulated signal from the attenuated signal; and automatically adjusting a phase delay of the phase-shifted signal and an attenuation of the attenuated signal according to a transmission frequency.

2. An apparatus for compensating for non-linear distortion generated during non-linear high-power amplification in a transmitter for quadrature-modulating a baseband signal, non-linearly high-power amplifying the quadrature-modulated baseband signal, extracting a non-linear distortion component from the non-linearly high-power amplified modulated signal, quadrature demodulating the extracted distortion component into a baseband distortion component, and overlapping a phase-inversed distortion component of the quadrature-demodulated baseband distortion component with the baseband signal, comprising:

a variable phase shifter for shifting a phase of a signal determined by quadrature modulating the baseband signal;

a high-power amplifier for non-linearly high-power amplifying the quadrature-modulated signal;

a variable attenuator for attenuating the amplified signal by a gain equal to that of the high-power amplifier;

a subtracter for extracting non-linear distortion generated during the non-linear high-power amplification by subtracting the phase-shifted quadrature-modulated signal from an output of the variable attenuator; and a control circuit for automatically adjusting a phase shift of the variable phase shifter and an attenuation of the variable attenuator according to a transmission frequency.

* * * * *